(12) United States Patent
Arai

(10) Patent No.: US 7,183,178 B2
(45) Date of Patent: Feb. 27, 2007

(54) METHOD OF MANUFACTURING SEMICONDUCTOR WAFER

(75) Inventor: Kazuhisa Arai, Tokyo (JP)

(73) Assignee: Disco Corporation, Tokyo (JP)

( * ) Notice: Subject to any disclaimer, the term of this patent is extended or adjusted under 35 U.S.C. 154(b) by 255 days.

(21) Appl. No.: 10/986,783

(22) Filed: Nov. 15, 2004

(65) Prior Publication Data

US 2005/0106840 A1    May 19, 2005

(30) Foreign Application Priority Data

Nov. 17, 2003   (JP)   .............................. 2003-386451

(51) Int. Cl.
*H01L 21/30*   (2006.01)
*H01L 21/46*   (2006.01)

(52) U.S. Cl. ...................... 438/459; 438/458; 438/464; 257/E21.237; 257/E21.484; 257/E21.567

(58) Field of Classification Search ................ 438/458, 438/459, 464; 257/E21.237, E21.484, E21.567
See application file for complete search history.

(56) References Cited

U.S. PATENT DOCUMENTS

2005/0233547 A1* 10/2005 Noda et al. ................. 438/459

FOREIGN PATENT DOCUMENTS

JP       2001-093863       4/2001
JP       2004-079889       3/2004

* cited by examiner

*Primary Examiner*—George R. Fourson
*Assistant Examiner*—Julio J. Maldonado
(74) *Attorney, Agent, or Firm*—Wenderoth, Lind & Ponack, L.L.P.

(57) ABSTRACT

A method of manufacturing a semiconductor wafer wherein a film is formed on a back surface of a starting semiconductor wafer formed with circuits in a front surface thereof. To prevent the semiconductor wafer from warping even when it is worked as very thin as 100 μm or below and to form the film uniformly on the back surface of the semiconductor wafer, the method includes a unification step of supporting the front surface of the semiconductor wafer on a support baseplate having a flat support surface, and then unifying the support baseplate and the semiconductor wafer with each other, a grinding work step of grinding the back surface of the semiconductor wafer to thin; and a film formation step of forming a film on the back surface of the semiconductor wafer with use of a film formation apparatus; wherein a protective tape capable of being torn off is stuck onto a back surface of the support baseplate at said unification step, so as to perform the subsequent grinding work step with the protective tape borne on the support baseplate; and a protective-tape tearing off and removal step of tearing off and removing the protective tape is carried out before performing said film formation step.

5 Claims, 3 Drawing Sheets

METHOD OF MANUFACTURING SEMICONDUCTOR WAFER

BACKGROUND OF THE INVENTION

1. Field of the Invention

The present invention relates to a method of manufacturing a semiconductor wafer wherein the back surface of a starting semiconductor wafer which is formed with a plurality of semiconductor chips, for example, ICs or LSIs, in its front surface is equally ground and thinned all over by a grinding apparatus, and an oxide film or the like is thereafter formed on the ground back surface.

2. Related Art

A semiconductor wafer of the type specified above, formed with a plurality of semiconductor chips such as ICs or LSIs, has its back surface ground and thinned by a grinding apparatus, and the ground semiconductor wafer is thereafter split into the individual semiconductor chips by a splitting apparatus such as dicing apparatus. The semiconductor chips are assembled and extensively utilized in the circuits of electric equipments such as portable telephones and personal computers.

Meanwhile, as the structures of semiconductor chips have been thinned in recent years, laminated chips in each of which semiconductor chips are vertically stacked to enhance functions, processability, a storage capacity, etc. have been put into practical use. Thus, it permits to make electric equipments, such as portable telephones and notebook type personal computers, thin in structure, small in size and light in weight.

In the manufacture of the laminated chips, at the stage of a semiconductor wafer, electrodes extending from the front surface of the semiconductor wafer formed with circuits to the back surface thereof are embedded, and they are exposed by subjecting the back surface to mechanical grinding or chemical etching. In addition, an insulating film such as SiO film is formed on the back surface of the semiconductor wafer in order to prevent copper or other metals forming the electrodes from diffusing into a semiconductor such as silicon.

Also a technique is put to practical use wherein, after the circuits of power transistors etc. have been formed in the front surface of a starting semiconductor wafer, the back surface of the semiconductor wafer is ground or etched, a metal film of titanium (Ti), silver (Ag), gold (Au) or the like is formed on the worked back surface to a thickness of several tens nm, thereby to construct a semiconductor wafer.

In such a case where the back surface of the semiconductor wafer formed with the circuits in the front surface is thinned by grinding, polishing or the like, and where the film is thereafter formed on the back surface, the semiconductor wafer needs to be formed as thin as possible, for the purpose of making the thermal and electrical characteristics of the semiconductor chips favorable.

However, when the semiconductor wafer is thinned and worked to a thickness of, for example, about 100 μm–15 μm, there is the problem that the semiconductor wafer is warped to hinder the formation of the film, so the film cannot be uniformly formed.

Especially, when the film formation is carried out by a reduced-pressure film formation apparatus to form the film in a reduced-pressure environment, a suction force cannot be used in a holding table for holding the semiconductor wafer, and the semiconductor wafer is held by an electrostatic scheme. Therefore, the stress of the film resists the holding force of the holding table based on the electrostatic scheme and warps the semiconductor wafer, and the film cannot be uniformly formed.

In the present situation, accordingly, the thickness of the semiconductor wafer is limited to about 200 μm in order to bestow enough rigidity to prevent the warp, and the semiconductor wafer cannot be formed to be thinner (refer to JP-A-2001-93863).

In order to realize the formation of a uniform film even when the semiconductor wafer is formed to be thinner in the case where the film is formed on the back surface of the semiconductor wafer, the inventor has developed a technique wherein the semiconductor wafer is stuck and supported on a support baseplate of high rigidity, such as glass baseplate, the semiconductor wafer has its back surface ground so as to be thinned to a required thickness in that state, and the required film is thereafter formed on the back surface of the semiconductor wafer by a film formation apparatus. The technique has already been applied for a patent under the name of the same assignee as that of the present application (refer to JP-A-2004079889).

In this regard, however, a problem has been revealed as stated below. When the back surface of the semiconductor wafer is ground by a grinding apparatus, contaminants having appeared during a grinding work step adhere to the back surface of the support baseplate, and the semiconductor wafer is thereafter subjected to a cleaning step. Herein, the adherent contaminants cannot be completely removed at the cleaning step. When the semiconductor wafer is transported into the film formation apparatus and is formed with the film under a reduced pressure, there occurs a problem that the contaminants not having been removed pollute the interior of the film formation apparatus, to degrade the quality of part of the film formed on the back surface of the semiconductor wafer.

SUMMARY OF THE INVENTION

In view of the above problem, an object of the present invention is to prevent from warping in grinding a back surface of a semiconductor wafer to thin the semiconductor wafer and in forming a film in a method of manufacturing the semiconductor wafer wherein the back surface of a starting semiconductor wafer formed with circuits in a front surface thereof is ground to thin the semiconductor wafer and wherein the thin film is formed on the ground back surface. Further, another object of the invention is to prevent contaminants appeared due to a grinding work step from entering the formed film as impurities during the film formation and from degrading the quality of the film.

The method of manufacturing a semiconductor wafer according to the invention wherein a film is formed on a back surface of a starting semiconductor wafer formed with circuits in a front surface thereof, comprises a unification step of supporting a front surface of a semiconductor wafer on a support baseplate having a flat support surface, and then unifying the support baseplate and the semiconductor wafer with each other; a grinding work step of holding a support baseplate side of the unified structure on a chuck table of a grinding apparatus, and then grinding a back surface of the semiconductor wafer to thin the semiconductor wafer by grinding means of the grinding apparatus; and a film formation step of holding the support baseplate side unified with the thinned semiconductor wafer, on a chuck table of a film formation apparatus, and then forming the film on the back surface of the semiconductor wafer by film formation means of the film formation apparatus, wherein a protective tape capable of being torn off is stuck onto a back surface of the support baseplate at the unification step, so as to perform the subsequent grinding work step with the protective tape borne on the support baseplate; and a protective-tape tearing-off and removal step of tearing off and removing the protective tape is interposed before the film formation step is performed. In this way, the semiconductor wafer can be uniformly thinned without warping, and the uniform film in which no contaminants coexist can be efficiently formed on the back surface of the semiconductor wafer.

Besides, the support baseplate to be used may be a glass baseplate or a polyether-imide baseplate whose thickness lies in a range of 1–3 mm. This support baseplate is formed substantially in the same shape as that of the semiconductor wafer. The semiconductor wafer and the support baseplate are stuck together through an adhesive of acryl type, ester type or urethane type. Further, the protective tape to be stuck onto the back surface of the support baseplate may be a polyvinyl-chloride tape or a polyolefin tape. The sticking of the protective tape to the support baseplate is performed at the unification step for the support baseplate and the semiconductor wafer, at least before the grinding work step. That is, in the unification step, the unification of the semiconductor wafer and the support baseplate as well as the sticking of the protective tape to the back surface of the support baseplate may well be performed simultaneously, also the protective tape may be stuck in advance of the unification of the semiconductor wafer and the support baseplate, and further the protective tape may well be stuck onto the back surface of the support baseplate after the unification of the semiconductor wafer and the support baseplate. In short, the protective tape must exist on the back surface of the support baseplate before the grinding work step.

In addition, the back surface side or protective-tape surface of the support baseplate unified with the semiconductor wafer is put on the chuck table of the grinding apparatus and is fixed by suction, and the back surface of the semiconductor wafer is ground to thin the semiconductor wafer by the grinding means. On this occasion, some of contaminants having appeared due to the grinding adhere onto the protective-tape surface under suction. The adherent contaminants cannot be completely removed even when a cleaning step is carried out after the grinding work step.

Assuming that some of the contaminants be brought into the film formation apparatus, they are scattered within the film formation apparatus upon the actuation of the film formation means under a reduced pressure, and they are deposited on the back surface of the semiconductor wafer together with a film forming substance, so that a film containing the impurities of the contaminants is partly formed. Therefore, after the cleaning step for the semiconductor wafer and the support baseplate in the unified state, and before the transportation of the unitary structure into the film formation apparatus, the protective tape polluted with the contaminants is torn off and removed. Thus, the contaminants can be completely removed from the back surface side of the support baseplate, and they are not brought into the film formation apparatus, so that the drawback ascribable to the contaminants can be eliminated at the film formation step.

As mentioned above, according to the method of manufacturing a semiconductor wafer of the invention, the grinding work step and the film formation step is implemented in a state where the starting semiconductor wafer is supported by the support baseplate of high rigidity. Therefore, even when the semiconductor wafer is worked to be as very thin as 100 μm or below at the grinding work step, a uniform film can be formed on the back surface of the semiconductor wafer without the warp of the semiconductor wafer, so that the semiconductor wafer can be thinned still further.

Further, the protective tape is stuck onto the back surface of the support baseplate before the grinding work step and torn off and removed before performing the film formation step, the film of high quality containing no impurities can be formed at the film formation step.

DETAILED DESCRIPTION OF PREFERRED EMBODIMENT

Figure 1:
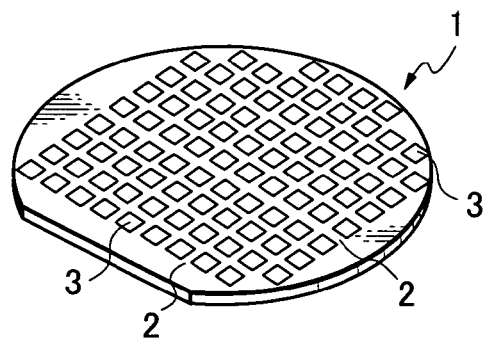
FIG. 1 is a perspective view showing an example of a semiconductor wafer to which the present invention is to be applied.

Now, a method of manufacturing a semiconductor wafer according to the present invention will be described with reference to the drawings. FIG. 1 shows a semiconductor wafer 1. There will be described a case where the back surface of the semiconductor wafer 1 is formed with a film after grinding or etching. In the front surface of the semiconductor wafer 1, a plurality of streets 2 are formed in a lattice shape at predetermined intervals, and circuit patterns are formed in a large number of rectangular regions demarcated by the streets 2. Besides, the respective rectangular regions are made into semiconductor chips 3 by dicing the streets 2.

Figure 2:
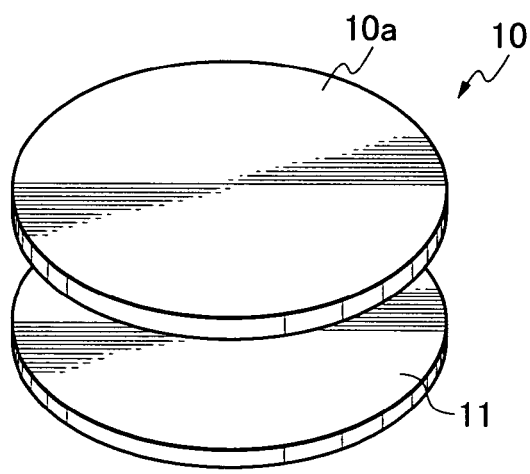
FIG. 2 is a perspective view showing examples of a support baseplate and a protective tape in separate conditions, which are to be unified with the semiconductor wafer.

Before the back surface of the semiconductor wafer 1 is ground or polished and is formed with the film thereon, this semiconductor wafer 1 is unified with a support baseplate 10 shown in FIG. 2. The support baseplate 10 is made of a member of high rigidity so that the semiconductor wafer 1 whose thickness has been made as very small as 100 μm or below by the grinding can be stably supported without being bent or warped. For example, a glass baseplate or a polyether-imide baseplate can be employed as the support baseplate 10. The baseplate formed from polyether-imide has the property that it is kept rigid without being deformed, even at a temperature of 200° C. Usable as the polyether-imide is "SUMILITE FS-1400" (trade name; Sumitomo Bakelite Company Limited) or "ULTEM1000" (trade name; Nihon G E. Plastics Company Limited) which is commercially available. Alternatively, ceramics, an alloy, a metal or a resin can be employed for the support baseplate 10. Anyway, the support baseplate made from any of such materials should desirably be about 1–3 mm thick.

Figure 3:
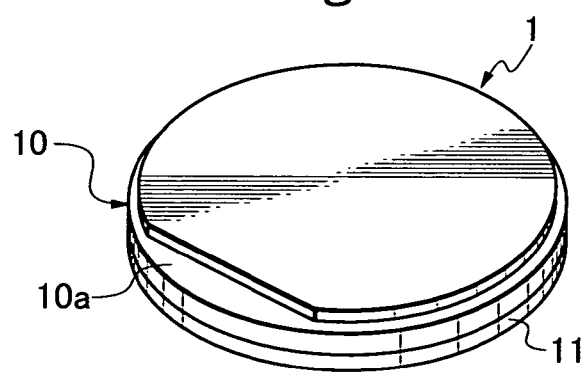
FIG. 3 is a perspective view showing a state where the semiconductor wafer and the support baseplate are unified, and where the protective tape is stuck.

The front surface 10a of the support baseplate 10 serving as a support surface and the back surface thereof are formed flat. As shown in FIG. 3, the support baseplate 10 and the semiconductor wafer 1 are stuck and unified by an adhesive so that the front surface 10a of the former and the front surface of the latter may oppose to each other, thereby to implement a so-called "unification step" for supporting the semiconductor wafer 1 on the front surface 10a. Owing to the unification step, the semiconductor wafer 1 is exposed on its back surface side where no circuits are formed.

The adhesive to be used should preferably be one made from a resin, for example, of acryl type, ester type or urethane type. Besides, in a case of employing a transparent baseplate as the support baseplate 10, the adhesive should preferably be of the type whose bonding strength is lowered by ultraviolet radiation. The reason therefor is that the ultraviolet radiation can be transmitted through the transparent baseplate later so as to irradiate the adhesive, so the support baseplate 10 and the semiconductor wafer 1 can be torn off with ease.

In the unification step, a protective tape 11 is stuck on the back surface side of the support baseplate 10. The protective tape 11 used in this case is, for example, a polyvinylchloride tape or a polyolefin tape. The protective tape 11 is stuck by using a taping machine known in the pertinent technical field. It is a requisite that the protective tape 11 is stuck on the back surface of the support baseplate 10 before the next grinding work step for thinning based on the grinding.

Figure 4:
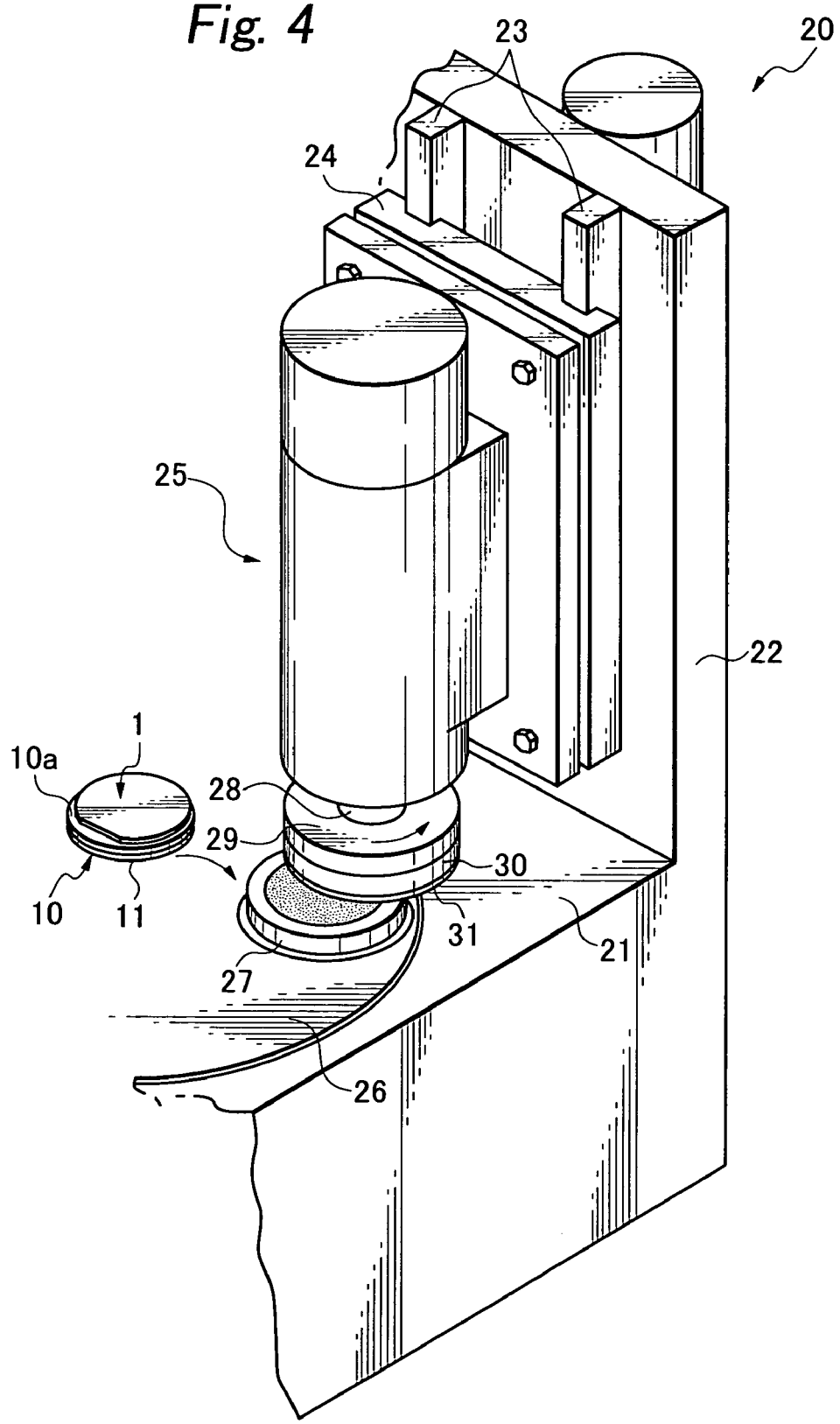
FIG. 4 is a perspective view showing an example of a grinding apparatus to be employed at a grinding work step for thinning in the invention.

Subsequently, the grinding work step for thinning is carried out in such a way that the back surface of the semiconductor wafer 1 supported on the support baseplate 10 as described above is ground or polished. A grinding or polishing apparatus (herein below, termed "grinding apparatus") 20 shown in FIG. 4 by way of example can be used for the grinding Work.

The grinding apparatus 20 is so constructed that a pair of rails 23 are disposed in a vertical direction on the inner surface of a wall portion 22 erected from the end part of a base 21, and that grinding means 25 as thinning work means attached to a support board 24 is moved up or down as the support board 24 ascends or descends along the rails 23. Besides, a turntable 26 is rotatably disposed on the base 21, and a plurality of chuck tables 27 for holding the workpieces to be ground or polished are rotatably disposed on the turntable 26.

The grinding means 25 is so constructed that a grinding wheel 30 is mounted through a mounter 29 on the distal end of a spindle 28 whose axis extends in the vertical direction, and that a grindstone 31 is secured to the lower surface of the grinding wheel 30 in a manner to rotate with the rotation of the spindle 28.

The semiconductor wafer 1 unified with the support baseplate 10 is supported by suction in such a way that the back surface side of the support baseplate 10 on which the protective tape 11 is stuck is held on the chuck table 27. The supported semiconductor wafer 1 is located directly under the grinding means 25 by the rotation of the turntable 26, and it is opposed to the grindstone 31 in a state where its back surface is turned up.

Besides, while the grindstone 31 is being rotated, the grinding means 25 descends to exert a thrust on the back surface of the semiconductor wafer 1, whereby the back surface is ground or polished. The grinding or polishing is performed in a predetermined amount, whereby the back surface is removed in the predetermined amount, and the semiconductor wafer 1 is worked to be thin and is formed to a desired thickness, for example, 100 μm–15 μm. Thus, the grinding work step for thinning is implemented.

Incidentally, a CMP apparatus, a dry etching apparatus, a wet etching apparatus, or the like can be employed as the thinning work apparatus, instead of the grinding apparatus 20 stated above. Also, the grinding apparatus and the etching apparatus may well be combined so that the ground surface (back surface) can be etched after the grinding.

After the grinding work step, the unified semiconductor wafer 1 is picked up from the grinding apparatus 20, and it is subjected to a cleaning step in order to remove adherent contaminants having appeared due to the grinding. The cleaning step is such that cleaning water is uniformly blown around the semiconductor wafer 1 and the support baseplate 10 which are unified, thereby to wash away the adherent contaminants.

Figure 5:
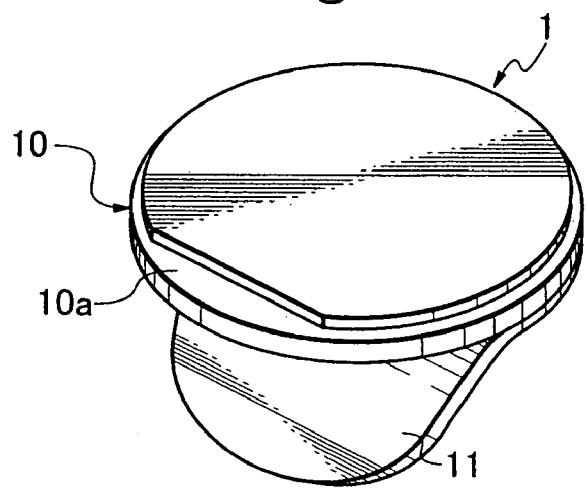
FIG. 5 is a perspective view showing a situation where the protective tape is torn off and removed from the back surface of the support baseplate unified with the semiconductor wafer, before a film formation step in the invention.

After the cleaning step, the unified semiconductor wafer 1 and support baseplate 10 are dewatered and dried, whereupon they are shifted to the next film formation step. Herein, before the semiconductor wafer 1 and the support baseplate 10 are transported into a film formation apparatus for performing the film formation step, the protective tape 11 stuck on the back surface of the support baseplate 10 is torn off and removed as shown in FIG. 5. That is, a tearing-off and removal step for the protective tape 11 polluted with contaminants is performed.

Figure 6:
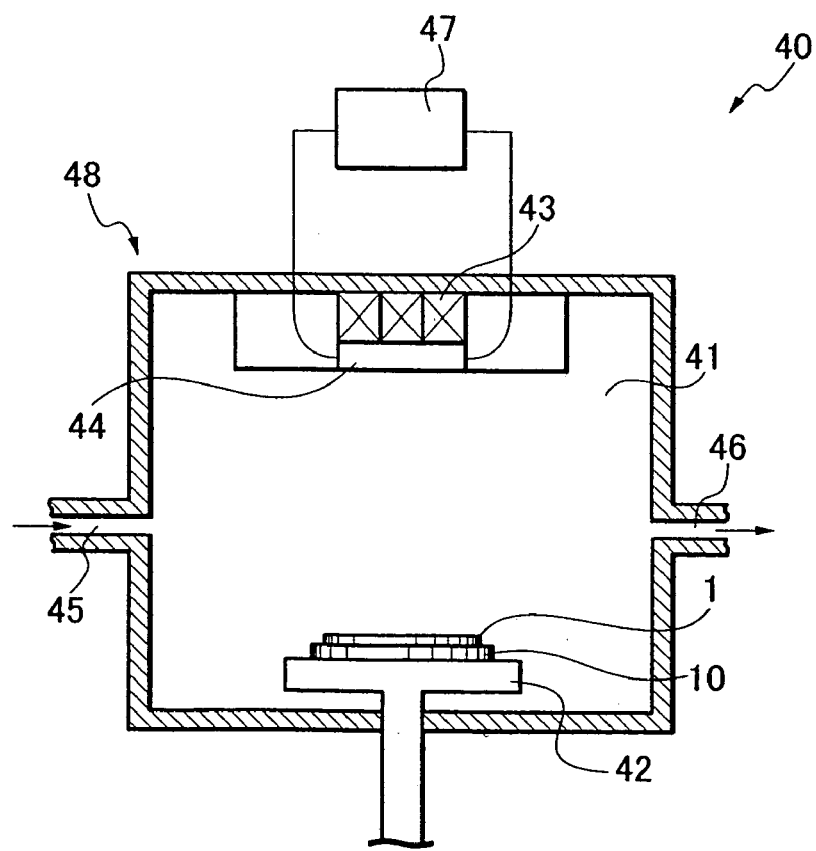
FIG. 6 is a schematic sectional view showing an example of a reduced-pressure film formation apparatus to be employed at a film formation step in the invention.

At the next film formation step, a film is formed on the back surface of the thinned and worked semiconductor wafer 1 by employing the appropriate film formation apparatus. A PVD (Physical Vapor Deposition) apparatus or a CVD (Chemical Vapor Deposition) apparatus can be employed as the film formation apparatus. Here in the embodiment of the invention, a case of using a reduced-pressure film formation apparatus 40 shown in FIG. 6 will be described below.

In the reduced-pressure film formation apparatus 40, a holding unit 42 to hold a flat object by an electrostatic scheme or a suction scheme based on a chuck table is disposed inside a sputtering chamber 41, and a sputtering source 44 of gold (Au) or the like supported by an excitation member 43 is disposed at the upper position of the sputtering chamber 41 opposite to the holding unit 42. A radio-frequency power source 47 is connected across the sputtering source 44. Besides, an introduction port 45 for introducing a sputtering gas is provided in one side part of the sputtering chamber 41, while a pressure reduction port 46 communicating with a pressure reducing source is provided in the other side part Herein, film formation means 48 is constituted by the sputtering chamber 41, excitation member 43, sputtering source 44, introduction port 45, pressure reduction port 46 and radio-frequency power source 47.

The back surface of the support baseplate 10 unified with the semiconductor wafer 1 is held on the holding unit 42, whereby the back surface of the semiconductor wafer 1 is held in opposition to the sputtering source 44. Besides, radio frequency power at about 40 kHz is applied from the radio-frequency power source 47 to the sputtering source 44 which is magnetized by the excitation member 43, the internal pressure of the sputtering chamber 41 is reduced to about $10^{-2}$ Pa–$10^{-4}$ Pa through the pressure reduction port 46 to establish a reduced-pressure environment, and an inert gas such as argon gas is introduced through the introduction portion 45, thereby to generate a plasma. Then, argon ions in the plasma collide against the sputtering source 44, and the metal particles of the sputtering source 44 are driven out and deposited onto the back surface of the semiconductor wafer 1, whereby the film is formed. Thus, the film formation step is implemented.

During the film formation performed as described above, the interior of the sputtering chamber 41 is substantially in a vacuum state, and the semiconductor wafer 1 is difficult of being held on the holding unit 42 by suction. Therefore, the semiconductor wafer 1 is held by the favorable electrostatic scheme. In this regard, when the thinned semiconductor wafer 1 is directly held on the holding unit 42 of the electrostatic scheme, it is warped because of a holding force weaker than that of the suction scheme.

In the invention, however, the semiconductor wafer 1 unified with the support baseplate 10 can be held through this support baseplate 10 of high rigidity which undergoes no warp, so that even the semiconductor wafer 1 formed to the thickness of about 100 μm–15 μm by the thinning work is not warped, and a uniform film can be formed at a high accuracy on the back surface of the semiconductor wafer 1. Moreover, the protective tape 11 is stuck on the back surface side of the support baseplate 10, the contaminants ascribable to the thinning work based on the grinding as otherwise adhere onto the back surface side of the support baseplate 10 are received by the protective tape 11, and the protective tape 11 is torn off and removed before the film formation step, thereby preventing the contaminants from entering the reduced-pressure film formation apparatus 40, so that the formation of the film of high accuracy not containing the impurities is realized.

To sum up, according to the invention, in a method of manufacturing a semiconductor wafer wherein the back surface of a starting semiconductor wafer formed with circuits in the front surface thereof is ground to thin the semiconductor wafer, and wherein a thin film is formed on the ground back surface, the semiconductor wafer is unified with a rigid support baseplate in order that the semiconductor wafer itself may be prevented from warping in grinding the back surface to thin the semiconductor wafer and in forming the film; a protective tape capable of being torn off is stuck on the back surface side of the support baseplate beforehand in order that some of contaminants having appeared at a grinding work step may be prevented from adhering onto the back surface side of the support baseplate, from being carried into a film formation apparatus, from entering the formed film as impurities during the film formation and from degrading the quality of the film; and the contaminants are completely removed from the support baseplate by tearing off and removing the protective tape before performing a film formation step, whereby the uniform film containing no impurities can be accurately formed on the back surface of the semiconductor wafer. The method according to the invention is extensively applicable to that manufacture of semiconductor chips in which the back surface of the semiconductor wafer of the specified type is efficiently ground to downsize and thin the semiconductor wafer, and in which the film of high quality is formed.

What is claimed is:

1. A method of manufacturing a semiconductor wafer wherein a film is formed on a back surface of a starting semiconductor wafer formed with circuits in a front surface thereof, comprising:

a unification step of supporting the front surface of the semiconductor wafer on a support baseplate having a flat support surface, and then unifying at least the support baseplate and the semiconductor wafer with each other;

a grinding work step of holding a support baseplate side of unified structure on a chuck table, and then grinding the back surface of the semiconductor wafer to thin the semiconductor wafer with use of a grinding apparatus including the chuck table for holding the semiconductor wafer thereon and a grinding means for grinding the back surface of the semiconductor wafer held on the chuck table; and a film formation step of holding the support baseplate side of the unified structure on a second chuck table, and then forming a film on the back surface of the semiconductor wafer with use of a film formation apparatus including the second chuck table for holding the semiconductor wafer thereon and a film formation means for forming the film on the surface of the semiconductor wafer held on the second chuck table;

wherein a protective tape capable of being torn off is stuck onto a back surface of the support baseplate at said unification step, so as to perform the subsequent grinding work step with the protective tape borne on the support baseplate; and a protective-tape tearing-off and removal step of tearing off and removing the protective tape is carried out before performing said film formation step.

2. A method of manufacturing a semiconductor wafer according to claim 1, wherein the support baseplate is a glass baseplate or a polyether-imide baseplate, while the protective tape is a polyvinyl-chloride tape and a polyolefin tape.

3. A method of manufacturing a semiconductor wafer as defined in claim 1, wherein a thickness of the support baseplate lies in a range of 1–3 mm.

4. A method of manufacturing a semiconductor wafer according to claim 1, wherein the semiconductor wafer is stuck onto the support baseplate through an adhesive of a type selected from a group consisting of an acryl type, an ester type and an urethane type at the unification step.

5. A method of manufacturing a semiconductor wafer as defined in claim 2, wherein a thickness of the support baseplate lies in a range of 1–3 mm.

* * * * *